United States Patent
Chou et al.

(10) Patent No.: US 7,683,396 B2
(45) Date of Patent: Mar. 23, 2010

(54) HIGH POWER LIGHT EMITTING DEVICE ASSEMBLY UTILIZING ESD PROTECTIVE MEANS SANDWICHED BETWEEN DUAL SUB-MOUNTS

(75) Inventors: Ming-Chieh Chou, Tainan (TW); Wen-Shan Lin, Kaohsiung (TW); Hung-Hsin Tsai, Tainan (TW)

(73) Assignee: Industrial Technology Research Institute, Hsinchu (TW)

( * ) Notice: Subject to any disclaimer, the term of this patent is extended or adjusted under 35 U.S.C. 154(b) by 110 days.

(21) Appl. No.: 11/582,298

(22) Filed: Oct. 18, 2006

(65) Prior Publication Data

US 2007/0210317 A1    Sep. 13, 2007

(30) Foreign Application Priority Data

Mar. 13, 2006    (TW) .............................. 95108357 A

(51) Int. Cl.
H01L 23/06    (2006.01)
H01L 33/00    (2006.01)

(52) U.S. Cl. .................... 257/99; 257/173; 257/684; 257/E33.046; 257/E33.047; 257/E33.045; 257/E33.048; 257/E33.051; 257/E33.052; 257/E33.055; 257/E33.058; 257/E33.059; 257/E33.062; 257/E33.06; 257/E33.075

(58) Field of Classification Search ............... 257/99, 257/81, 684, E33.045, E33.046, E33.047, 257/E33.048, E33.051, 33.052, E33.055, 257/E33.058, E33.075, E33.06, E33.059, 257/E33.062, 173; 438/26

See application file for complete search history.

(56) References Cited

U.S. PATENT DOCUMENTS

| | | | |
|---|---|---|---|
| 4,926,242 A * | 5/1990 | Itoh et al. | 257/720 |
| 6,054,716 A | 4/2000 | Sonobe et al. | |
| 6,333,522 B1 | 12/2001 | Inoue et al. | |
| 6,642,550 B1 * | 11/2003 | Whitworth et al. | 257/99 |
| 7,244,965 B2 * | 7/2007 | Andrews et al. | 257/98 |
| 7,268,014 B2 * | 9/2007 | Lee et al. | 438/106 |
| 7,279,724 B2 * | 10/2007 | Collins et al. | 257/103 |
| 2003/0098459 A1 * | 5/2003 | Horiuchi et al. | 257/81 |
| 2005/0121686 A1 * | 6/2005 | Keller et al. | 257/99 |
| 2007/0170450 A1 * | 7/2007 | Murphy | 257/99 |

* cited by examiner

*Primary Examiner*—Phat X Cao
*Assistant Examiner*—Diana C Garrity
(74) *Attorney, Agent, or Firm*—Birch, Stewart, Kolasch & Birch, LLP

(57) ABSTRACT

A high power light emitting device assembly with electro-static-discharge (ESD) protection ability and the method of manufacturing the same, the assembly comprising: at least two sub-mounts, respectively being electrically connected to an anode electrode and a cathode electrode, each being made of a metal of high electric conductivity and high thermal conductivity; a light emitting device, arranged on the sub-mounts; and an ESD protection die, sandwiched and glued between the sub-mounts, for enabling the high-power operating light emitting device to have good heat dissipating path while preventing the same to be damaged by transient power overload of static surge.

20 Claims, 8 Drawing Sheets

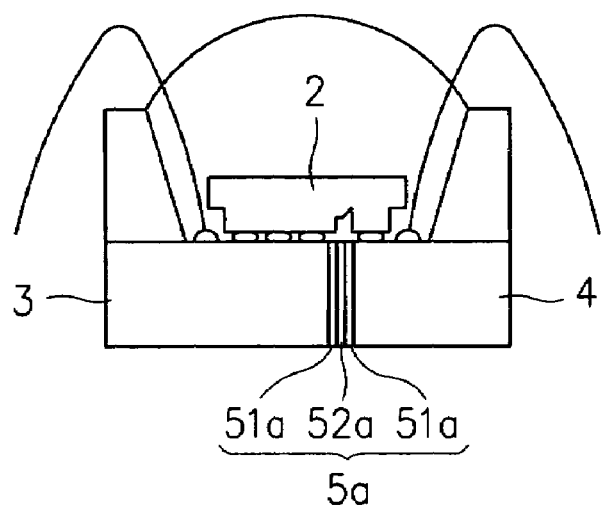
FIG. 9
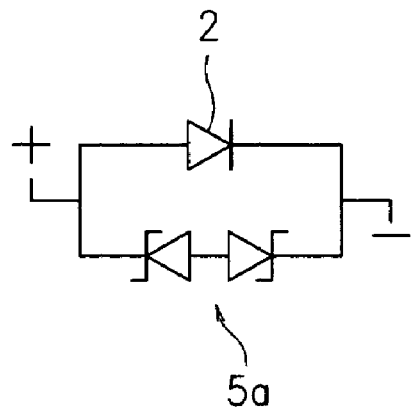
FIG. 10
| | LED Temp. (°C) | Sub-mount Temp. (°C) | Rj-s Thermal Resistance(°C/W) |
|---|---|---|---|
| Present Invention | 62.38 | 54.98 | 7.39 |
| Prior Art | 67.75 | 54.85 | 12.89 |
FIG. 11

HIGH POWER LIGHT EMITTING DEVICE ASSEMBLY UTILIZING ESD PROTECTIVE MEANS SANDWICHED BETWEEN DUAL SUB-MOUNTS

FIELD OF THE INVENTION

The present invention relates to a light emitting device assembly with electro-static-discharge (ESD) protection ability, and more particularly, to an assembly with ESD protection dies, adapted for packaging high power point light source of light emitting diode, or high power light source module of light emitting diode, which is applicable in a single chip package, a serial multi-chip package or a parallel multi-chip package since it is not only equipped with ESD protection ability, but also has comparatively lower thermal resistance and superior heat dissipating ability.

BACKGROUND OF THE INVENTION

Light emitting diode (LED) is a semiconductor diode that emits incoherent monochromatic light when electrically biased in the forward direction, that LED is considered to be the next level of technology when it comes to a light bulb. LED development began with infrared and red devices made with gallium arsenide (GaAs) since 1960. Advances in materials science have made possible the production of devices with ever shorter wavelengths, producing light in a variety of colors such as LEDs made of aluminum gallium indium phosphide (AlGaInP) for emitting high-brightness orange-red, orange, yellow, and green. Recently, as the breakthrough of epitaxy technology, commercially viable blue LEDs based on the wide band gap semiconductor gallium nitride (GaN) were invented by Shuji Nakamura while working in Japan at Nichia Corporation in 1993 and became widely available in the late 1990s. They can be added to existing red and green LEDs to produce white light, though white LEDs today rarely use this principle. Most "white" LEDs in production today use a blue GaN LED covered by a yellowish phosphor coating that can be employed as the illuminating device of the future. Compared to incandescent lights, LEDs are of interest because of the inherent characteristics: (1) They are compact; (2) They have a very long life, offering high reliability; (3) They can be driven by low-voltage DC; (4) They can be modulated (turned off and on) at high speeds; (5) They have good color mixing ability, offering almost endless color changing possibilities; (6) The light produced thereby is highly directional; (7) They have good vibration resisting ability; (8) They can produce incoherent monochromatic light. In addition, LEDs are considered to be environmental friendly since there is no mercury contained therein as there are in fluorescence bulbs. However, there are still disadvantages of using LEDs that require to be overcome, which primary are as following: (a) LEDs are currently more expensive than more conventional lighting technologie, whereas the additional expense partially stems from the relatively low lumen output and drive circuitry/power supplies needed. (b) LED performance largely depends on the ambient temperature of the operating environment, whereas "Driving" an LED 'hard' in high ambient temperatures may result in overheating of the LED package, eventually to device failure, and thus adequate heat-sinking is required to maintain long life.

In order to enhance brightness, a high brightness LED requires a larger current, i.e. about 350 mA~1000 mA, compared with conventional LEDs. However, the waste heat resulting from the high power operation must be effectively managed and dissipated, such that the luminescence efficiency of the LED can be enhanced while preventing the same from damaged by overheating. Currently, a LED fabrication process of flip-chip technology is commonly adopted for overcoming the problems of luminescence efficiency enhancing and heat dissipating, wherein the designing of an improved sub-mount is the focal point for improving heat dissipating ability of LEDs. There are already a variety of LED packages taking advantage of the forgoing flip-chip process and improved sub-mount.

Moreover, another LED package problem encountered is related to electrostatic discharge (ESD), that is highly probable to cause adverse affect on the quality and production yield of LED, and thus cause the production of high brightness LEDs to be more expensive. The reasoning is that LEDs can be damaged or degraded by human touch since there may be static electricity, as high as 2000V~3000V, accumulated in a human body in dry ambient. In reality, the substrate of a red LED made of aluminum gallium indium phosphide (AlGaInP) is a semiconductor substrate, which has good conductivity and thus is capable of preventing the accumulation of static electric charges. On the other hand, blue LEDs, especially those made of InGaN, must be fabricated on a specific substrate by an epitaxy procedure, such as a sapphire substrate and a 6H—SiC substrates, for facilitating the formation of the InGaN crystal. Selecting between a sapphire substrate and a 6H—SiC substrate, the sapphire substrate is usually being adopted for fabricating a blue LED as it has characteristics superior to those of the 6H—SiC substrate. In addition to the cost of fabricating blue, green or white LEDs is much higher than LEDs of other colors, LEDs made of sapphire substrate is comparatively highly vulnerable to electrostatic discharge since sapphire is an insulation material that is easier to cause electrostatic effect comparing to red LEDs. Therefore, it is important to add certain ESD protection dies in LED packages.

ESD protection in conventional LED packages is realized by connecting a LED with a zener diode in a parallel-connection manner, that is illustrated in the circuitry shown in FIG. 1. When the circuitry of FIG. 1 is working normally while subjecting to a normal operating voltage, the high power LED 11 is subjected to a forward bias of about 3V~4V and the zener diode 12 is subjected to a reverse bias. It is known that the breakdown voltage of a typical zener diode is about 7V, which is controlled by the doping density of the zener diode. Therefore, as the LED 11 is conducted to illuminate while subjecting to the normal operating voltage, the zener diode 12 is not conducted and waste no power. But, when a transient static of high-voltage is generated, which is ranged between 2 kV to 15 kV, both the LED 11 and the zener diode will be conducted, moreover, as the voltage of the static is exceeding the breakdown voltage of the zener diode 12, the resistance of the zener diode 12 will be far lower than the internal resistance of the LED 11 such that almost all the current resulting from the static will flow pass the zener diode 12, and thus the operating voltage is stabilized and the LED 11 is protected from the ESD.

There are already a variety of LED packages using zener diode for ESD protection. One such LED package is disclosed in U.S. Pat. No. 6,054,716, entitled "Semiconductor light emitting device having a protecting device", shown in FIG. 2. As seen in FIG. 2, a LED 53 is disposed at the bottom of the bowl-like structure 61 arranged on top of the leadframe 52a while a zener diode 55 is disposed at the top of the bowl-like structure 61. Since the LED 53 and the zener diode 55 are all connected by a wire bonding method, there are three bonding wires 66, 67, 68 and two pads 63, 65 arranged over the top of the LED 53, which are going to block the light emitting from the LED 53 and thus cause the brightness of the LED package to reduce greatly. In addition, as the LED 53 is connected to the bottom of the bowl-like structure 61 through its sapphire substrate 57, whose thermal conductivity is comparatively pretty low, i.e. about 25 W/m*K, such that the waste heat generated by the LED 53 can not be discharge smoothly. Therefore, the LED package shown in FIG. 2 is not suitable to be applied in high brightness applications.

Another such LED package is disclosed in U.S. Pat. No. 6,333,522, entitled "Light-emitting element, semiconductor light-emitting device and manufacturing methods thereof", shown in FIG. 3. As seen in FIG. 3, a LED 1 is mounted face-down on a zener diode 2' by a flip-chip process, wherein the LED 1 is parallel-connected to the zener diode 2' by connecting the p-side electrode 5' of the LED 1 to the n-side electrode 8 of the zener diode 2' while connecting the n-side electrode 6' of the LED 1 to the p-side electrode 7' of the zener diode 2' and a p-type semiconductor region 21 of the zener diode 2' is formed by selectively implanting impurity ions into an n-type silicon substrate 20. As shown in FIG. 3, The LED package is characterized in that a the LED 1 is mounted on leadframes 13a and 13b with the zener diode 2' having p-side and n-side electrodes interposed therebetween, not directly on the leadframes, wherein the zener diode 2' is die-bonded to the die pad with an Ag paste 14, while having an n-side electrode 9 on the back face thereof in contact with the die pad of the leadframe 13a; and the p-side and n-side electrodes 5' and 6' of the LED 1 are electrically connected to the n-side and p-side electrodes 8 and 7' of the zener diode 2' via Au microbump 12' and 11', respectively, while the p-side electrode of the zener diode 2' is connected by wire bonding to the lead frame 13b via an Au wire 17. Since the connection of the LED package of FIG. 3 is realized by a flip chip process, there is no bonding wire crossing over the light emitting surface of the LED 1 such that the obstruction of light caused by the disposition of wires and bonding pads, as those shown in FIG. 2, can be prevented. However, the LED package of FIG. 3 still has shortcomings listed as following:

(1) Since the alignment of the LED 1 and the zener diode 2' is difficult to realize, the production yield is difficult to increase.

(2) In order to prevent the overflow of the Ag paste 14, the thickness of the zener diode 2' must exceed a specific thickness.

(3) The size of the Au microbumps 11', 12' must be small enough since over-sized Au microbumps 11', 12' might cause shortage between the n-side and p-side electrodes 8 and 7' of the zener diode 2'.

(4) Since the sub-mount of the LED 1 is a silicon-based zener diode 2' that its thickness is specified to exceed a certain limit, the heat dissipating ability of the LED package is not satisfactory comparing to those made of metal substrate with low thermal resistance.

Please refer to FIG. 4 and FIG. 5, which are respectively a schematic diagram showing a LED package of Lumileds Lighting, LLC., and a schematic diagram showing a circuit of the LED package of FIG. 4. The LED 7" shown in FIG. 4 claims to be the brightest point light source currently available, that is fabricated by a principle similar to that of FIG. 3 as the sub-mounts of the two LEDs are all made of silicon, while enabling zener diodes 72 to be formed in the silicon sub-mount 71. The difference between the two LED packages is that a pair of zener diodes 72, arranged back to back, are formed in the sub-mount 71 for ESD protection, instead of only one zener diode being formed. In addition, instead of the leadframes of FIG. 3, the bottom of the LED 7" is connect to a flat metal block 73 of high conductivity, such as copper or aluminum, that is employed as heat dissipating path and thus the overall thermal resistance of the LED package is reduce. Nevertheless, since the forgoing LED package still use silicon sub-mount, its thermal resistance, similar to that of FIG. 3, is still not satisfactory.

From the prior-art LED packages described above, one can conclude that current high power LEDs with ESD protection ability still have shortcomings as following:

(1) If the electrical connection of a LED is enabled using a wire bonding means, the heat generated thereby must be dissipated through its sapphire substrate of low thermal conductivity, such that the overall thermal resistance of the LED package can not be reduced.

(2) If the bonding wires and bonding pads are disposed at the discharging direction of the light emitted by the LED, not only the light emitted thereby is blocked, but also the light emitting area is decreased, and thus the brightness of the LED is reduced.

(3) Since the thermal resistance of conventional leadframe-type LED package is comparatively too large, a larger, thinner sub-mount is required for reducing thermal resistance of the overall LED package.

(4) If zener diodes are adopted as sub-mount of an LED package, the thickness thereof is restricted in order to prevent the overflow of silver paste such that thickness of the LED package can not be reduced.

(5) Although the heat dissipating efficiency of a silicon sub-mount is acceptable it is still inferior to that of metal substrate.

Therefore, an improved light emitting device assembly with ESD protection ability is required.

SUMMARY OF THE INVENTION

In view of the disadvantages of prior art, the present invention might provide a light emitting device assembly with electro-static-discharge (ESD) protection ability, which is applicable in a single chip package, a serial multi-chip package or a parallel multi-chip package since it is not only equipped with ESD protection ability, but also has comparatively lower thermal resistance and superior heat dissipating ability.

The invention might also provide a light emitting device assembly with electro-static-discharge (ESD) protection ability, which is adapted for packaging high power point light source of light emitting diode, or high power light source module of light emitting diode.

So, the present invention provides a light emitting device assembly with electro-static-discharge (ESD) protection ability, comprising:

at least a light emitting device, each capable of emitting light;

at least two sub-mounts, disposed under the at least one light emitting device while electrically connecting to anode and cathode electrodes of the at least one light emitting device in respective; and at least an ESD protection die, each being sandwiched and glued between the sub-mounts.

In addition, to achieve the above objects, the present invention provides a method for manufacturing a light emitting device assembly with ESD protection ability, comprising steps of:

(a) sandwiching and gluing an ESD protection die between two metal plate for forming a stacked structure, and then dicing the stacked structure into a plurality of dices;

(b) rotating a dice selected from the plural dices;

(c) connecting at least a light emitting device to the dice by a flip chip process; and (d) connecting the two metal layers of the dice to an anode electrode and a cathode electrode in respective.

Other aspects and advantages of the present invention will become apparent from the following detailed description, taken in conjunction with the accompanying drawings, illustrating by way of example the principles of the present invention.

BRIEF DESCRIPTION OF THE DRAWINGS

FIG. 9 is a schematic diagram showing a LED assembly according to another preferred embodiment of the invention.

FIG. 10 is a schematic diagram showing a circuitry of the LED assembly of FIG. 9.

FIG. 11 is a table comparing the temperatures and thermal resistance of a LED assembly of present invention to a prior-art LED assembly.

DESCRIPTION OF THE PREFERRED EMBODIMENT

For your esteemed members of reviewing committee to further understand and recognize the fulfilled functions and structural characteristics of the invention, several preferable embodiments cooperating with detailed description are presented as the follows.

Figure 6:
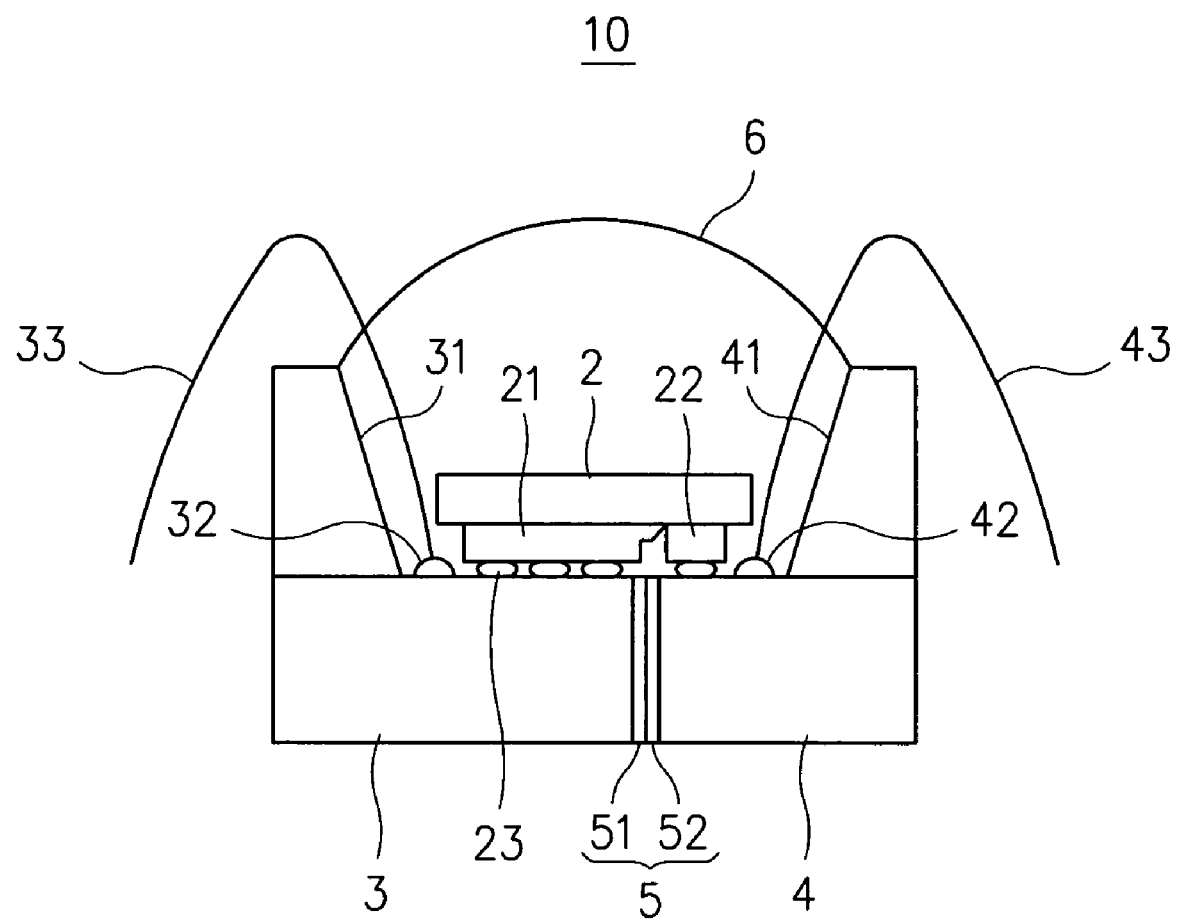
FIG. 6 is a schematic diagram showing a LED assembly according to a preferred embodiment of the invention.

Please refer to FIG. 6, which is a schematic diagram showing a LED assembly according to a preferred embodiment of the invention. As seen in FIG. 6, the LED assembly is primarily composed of a light emitting diode (LED) 2, two sub-mounts 3, 4 and an ESD protection die 5. Wherein, the LED 2 is a LED chip having a p-side electrode 21 and an n-side electrode 22, which is disposed on the two sub-mounts 3, 4. Moreover, the LED 2 can be replaced by any solid-state light source capable of emitting light, that is not limited to be the LED 2 shown in FIG. 6.

The sub-mounts 3, 4 are either made of made of a metal of high conductivity and high thermal conductivity, such as copper, aluminum, iron, or the alloy thereof, or made of a composite metallic material of high conductivity, high thermal conductivity and low thermal expansion coefficient, such as Cu/Mo/Cu (CMC), etc.

Figure 14:
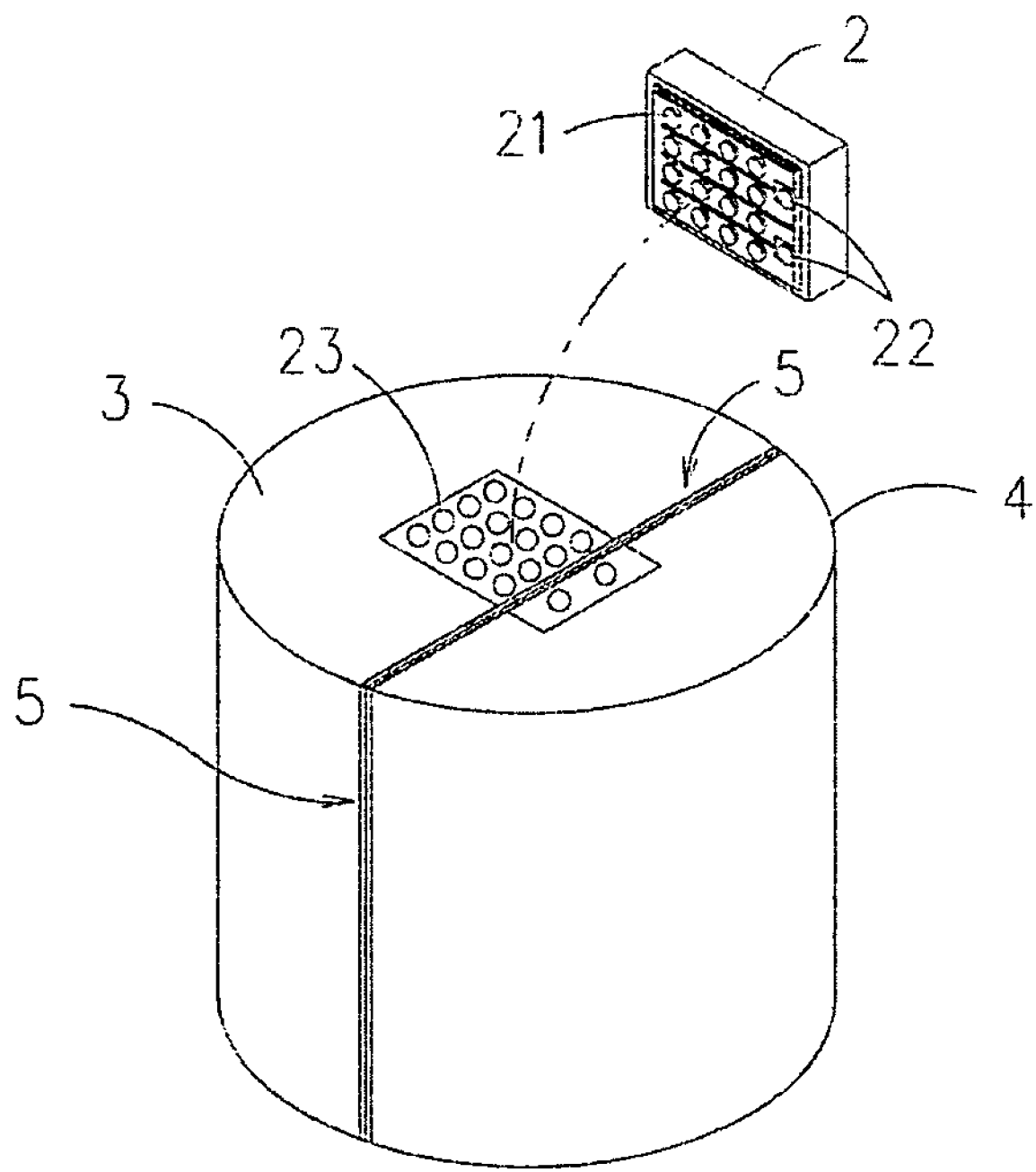
FIG. 14 shows a LED assembly according to still another preferred embodiment of the invention.

The p-side and the n-side electrodes 21, 22 of the LED 2 are respectively and electrically connected to the two sub-mounts 3, 4 by Au micro-bumps 23. As seen in FIG. 6, there are two inclined planes 31, 41 formed on top of the two sub-mounts 3, 4 in respective, each being used for reflecting and congregating light emitted by the LED 2. Each of the two inclined planes 31, 41 can be made of material the same as that of the corresponding sub-mounts 3, 4, that is, it can be either made of made of a metal of high conductivity and high thermal conductivity, such as copper, aluminum, iron, or the alloy thereof, or made of a composite metallic material of high conductivity, high thermal conductivity and low thermal expansion coefficient, such as Cu/Mo/Cu (CMC), etc. Thus, each inclined plane can be an extension of its corresponding sub-mount extending from the top thereof and being integrally formed therewith, such that a bowl-like formation combining the inclined planes 31, 41 and the two sub-mounts 3, 4 can be constructed while the contour of the formation can be a rectangle, a polygon or a circle (see FIG. 14). Furthermore, two conductive joints 32, 42 are arranged respectively on the two sub-mounts 3, 4, which are used for enabling conducting wires 33, 43 to be welded and connected thereto while enabling the conducting wires 33, 43 to extend and protrude outside the corresponding sub-mounts 3, 4 for connecting the same to an external anode or cathode electrodes.

Figure 1:
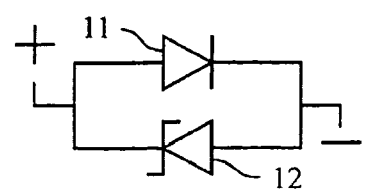
FIG. 1 is a circuitry illustrating a LED being parallel-connected to a zener diode.
Figure 2:
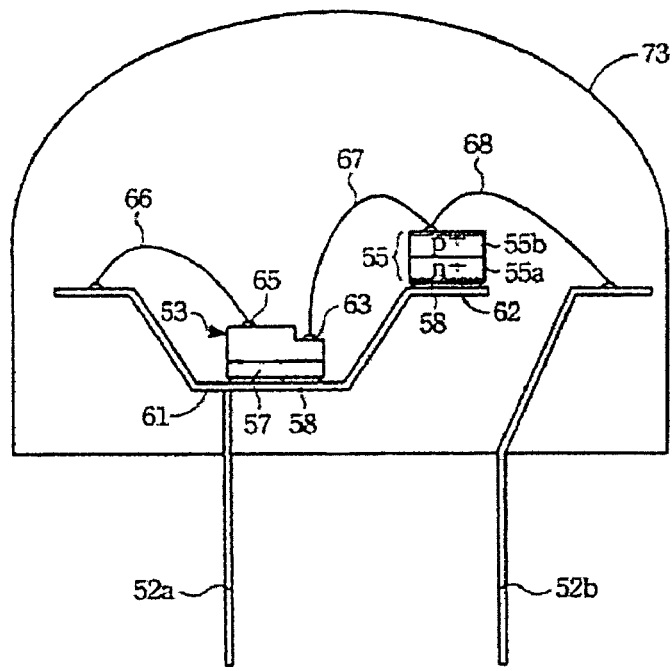
FIG. 2 is a schematic diagram showing a LED package disclosed in U.S. Pat. No. 6,054,716.
Figure 3:
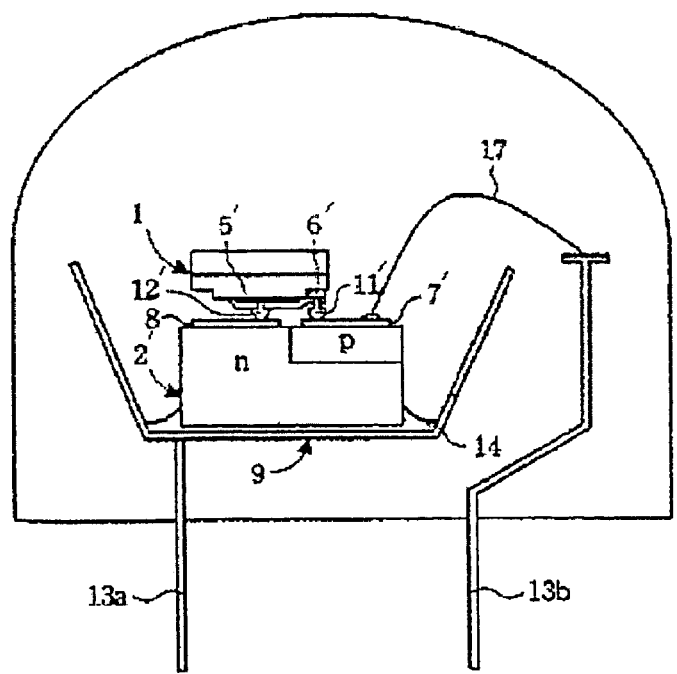
FIG. 3 is a schematic diagram showing a LED package disclosed in U.S. Pat. No. 6,333,522.

The ESD protection die 5 is sandwiched between the two sub-mounts 3, 4 while being electrically connected to the LED 2 in a reverse parallel connection manner, similar to that depicted in FIG. 1. The ESD protection die 5 can be a zener diode, a Schottky-barrier diode, a silicon diode, a III-V Compound diode or the combination thereof, which is comprised of a n-type doped region 51 and a p-type doped region 52, being adhered to the two sub-mounts 3, 4 in respective.

In the preferred embodiment shown in FIG. 6, the light emitting surface of the LED 2 is sealed and packaged by a transparent material 6, which can be a transparent resin or epoxy resin, such that not only the LED assembly is enabled with light congregating or diffusion function, but also the LED 2 can be protected.

Figure 7A:
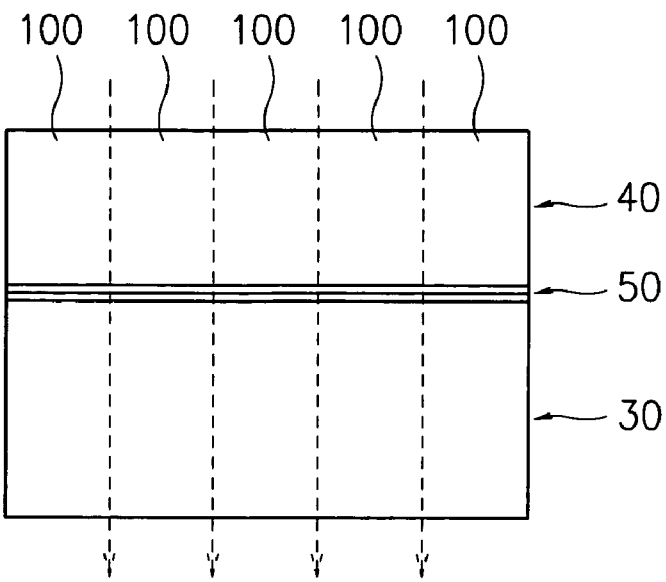
FIG. 7A to FIG. 7C shows steps of a manufacturing method according to the present invention.

The LED assembly described above can be manufactured by a manufacturing method, comprising steps of:

(a) Stacking and dicing, as shown in FIG. 7A: First, a bottom plate 30 with thickness ranged between 300 μm~3000 μm is provided, which is made of metal of high conductivity and high thermal conductivity. Then, a previous-formed ESD protection die 50 is stacked on the bottom plate 30 after being coated with a layer of paste. It is noted that the thickness of the ESD protection die 50 is ranged between 10 μm~200 μm, since a thin ESD protection die is easy to crack by the posterior polishing process while a thick ESD protection die will adversely affect the area available for flip chip bonding. Thereafter, a top plate 40 is stacked on the ESD protection die 50 after being coated with a layer of paste, wherein the thickness of the top plate 40 is similar to that of the bottom plate 30. Finally, the stacked structure is diced by a wafer cutting machine into a plurality of rectangle dices 100, each being about 300 μm~6000 μm in both length and width, and about 300 μm~3000 μm in thickness.

Figure 7B:
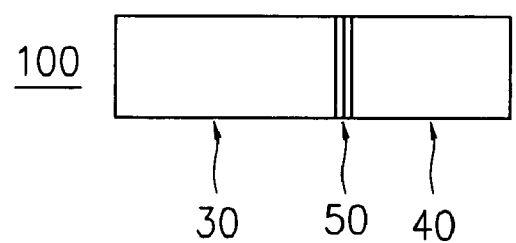

(b) Rotating, as shown in FIG. 7B: In this step, a dice 100 is selected to be rotate for preparing the same for a posterior flip chip process. The rectangle dice 100 shown in FIG. 7B is already rotated, whereas it can be rotated by a variety of means. One such means is using a robotic arm capable of 90-degree rotation to pick up and rotate each rectangle dice 100 and thus place the picked-and-rotated dice 100 in a holder specifically designed for the flip chip process. It is noted that the apparatus and means capable of the aforesaid rotation process are various, that are not limited by the abovementioned robotic arm.

Figure 7C:
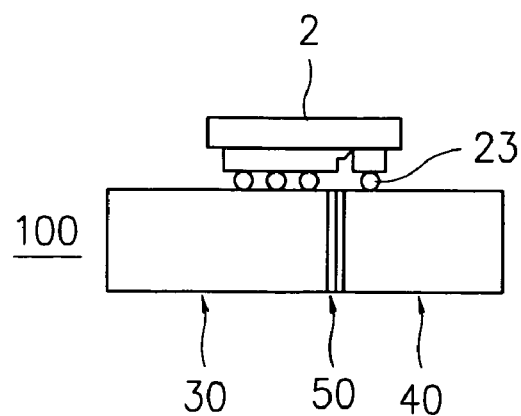

(c) Performing a flip chip process, as shown in FIG. 7C: The bonding of the flip chip process can be performed by solder joint, or thermosonic bonding. In the process shown in FIG. 7C, a plurality of Au micro-bumps 23 are placed on each dice 100 so as to bond the LED 2 to the dice 100 by soldering.

Comparing the assembly of FIG. 7C with that shown in FIG. 6, it is noted that the top plate 30 and the bottom plate 40 are the two sub-mounts 3, 4 shown in FIG. 6 while the ESD protection die 50 is the ESD protection die 5 of FIG. 6. Therefore, By processing the assembly of FIG. 7C for forming two conductive joints 32, 42, two conductive wires 33, 43 and two inclined planes 31, 41 thereon while sealing the formation with the transparent packaging material 6, an LED assembly similar to the assembly 10 shown in FIG. 6 is achieved.

Figure 8:
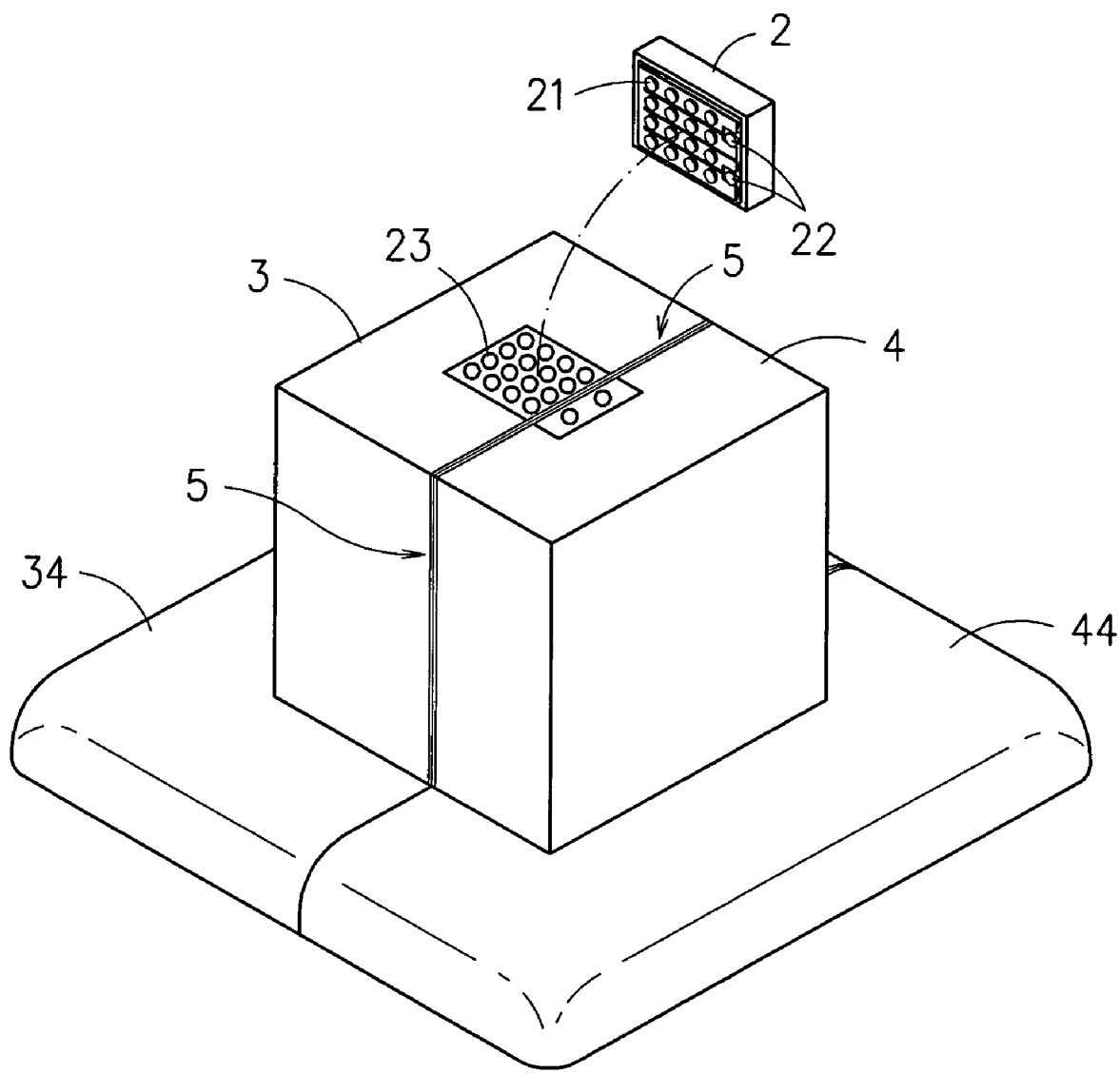
FIG. 8 is a three-dimensional diagram showing a LED assembly according to a preferred embodiment of the invention.

Please refer to FIG. 8, which is a three-dimensional diagram showing a LED assembly according to a preferred embodiment of the invention. In this embodiment, two bases 34, 44, which are slightly larger than the two sub-mounts 3, 4 in respective, are disposed under the two sub-mounts 3, 4, such that the LED assembly formed thereby can have a stable frame. In a preferred aspect, the bases 34, 44 can be made of mutually insulated materials, or can be made of materials the same as those made of the two sub-mounts 3, 4. However, if the two bases 34, 44 are made of materials of high conductivity and high thermal conductivity, an insulating material therebetween is required to be sandwiched between the two bases 34, 44 for insulating the two bases 34, 44 from each other. Moreover, the ESD protection die 5 is sandwiched between the two sub-mounts 3, 4; and a plurality of Au micro-bumps 23 are disposed on top of the two sub-mounts 3, 4 at positions corresponding to the p-side and n-side electrodes 21, 22 of the LED 2, by which the LED 2 can be solder to the two sub-mounts 3, 4 for achieving electrical conduction.

Please refer to FIG. 9, which is a schematic diagram showing a LED assembly according to another preferred embodiment of the invention. Similar to the LED assembly 10 shown in FIG. 6, a LED 2 is mounted on two sub-mounts 3, 4. The characteristic of the embodiment shown in FIG. 9 is that the ESD protection die 5a is a back-to-back LED structure, that the polarity arrangement of the back-to-back LED structure 5a is selected from the group consisting of PNP and NPN, as illustrated in the circuitry of FIG. 10. That is, a p-type doped region 52a is sandwiched between two n-type doped region 51a, or an n-type doped region 51a is sandwiched between two p-type doped region 52a. The PNP or NPN arrangement can enhance the ESD protection ability of the resulting LED assembly. Moreover, when there are more than one LED parallelly connected in the circuitry of FIG. 10, electrical conduction can be preserve even when one of those parallel-connected LED is damaged as the ESD protection die 5a can still enable a voltage-drop.

Figure 4:
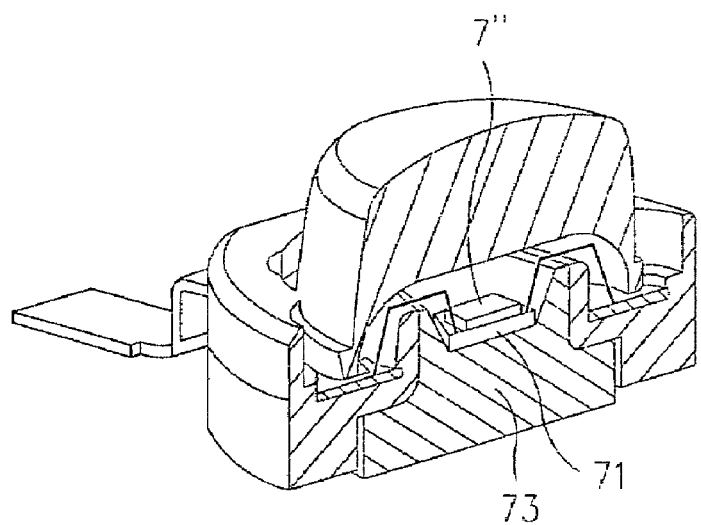
FIG. 4 is a schematic diagram showing a LED package of Lumileds Lighting.
Figure 5:
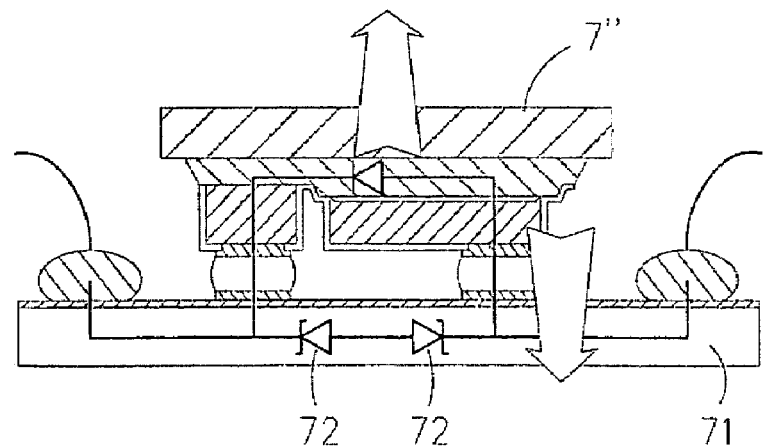
FIG. 5 is a schematic diagram showing a circuit of the LED package of FIG. 4.

Please refer to FIG. 11, which is a table comparing the temperatures and thermal resistance of a LED assembly of present invention to a prior-art LED assembly. The table of FIG. 11 reveals a comparison of heat dissipating ability between a LED assembly of the present invention and the prior-art LED assembly of FIG. 4, which is evaluated using FLOTHERM simulation software under the same boundary conditions and operating parameters. As shown in FIG. 11, the sub-mount temperatures of the two LED assemblies are equivalent to each other, however, the LED temperature of the present invention is 62.38° C., which is obviously lower than the 67.75° C. LED temperature of the prior-art LED assembly. Moreover, the thermal resistance $R_{j-s}$ of the present invention is 7.39° C./W, which is also obviously lower than the 12.89° C./W thermal resistance of the prior-art LED assembly.

Figure 12:
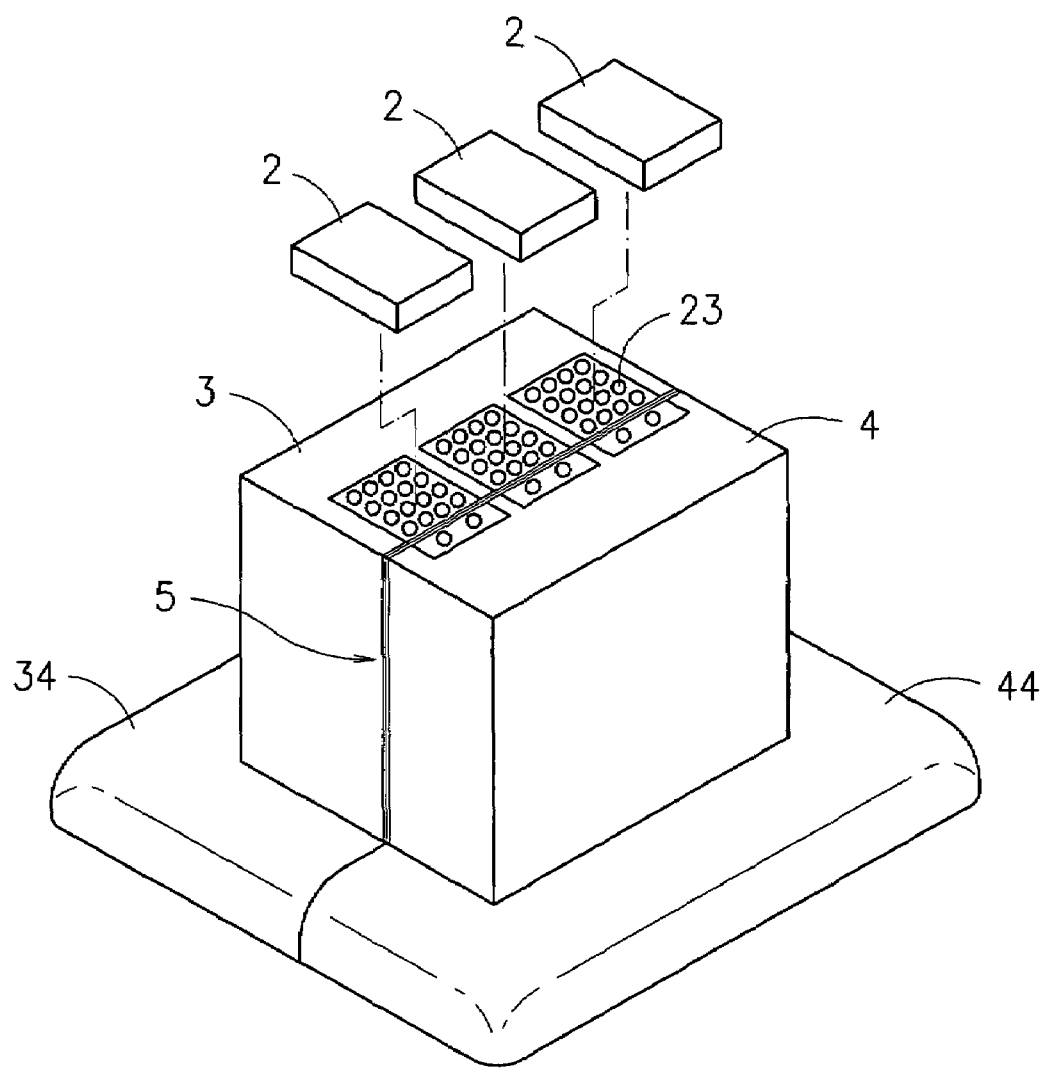
FIG. 12 is a schematic diagram showing a LED assembly according to yet another preferred embodiment of the invention.
Figure 13:
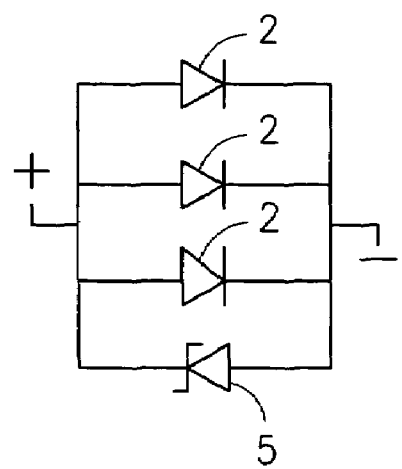
FIG. 13 is a schematic diagram showing a circuitry of the LED assembly of FIG. 12.

Please refer to FIG. 12, which is a schematic diagram showing a LED assembly according to yet another preferred embodiment of the invention. Similar to the LED assembly 10 shown in FIG. 8, two bases 34, 44, which are slightly larger than the two sub-mounts 3, 4 in respective and made of mutually insulated materials, are disposed under the two sub-mounts 3, 4, such that the LED assembly formed thereby can have a stable frame. Moreover, the ESD protection die 5 is sandwiched between the two sub-mounts 3, 4, while the ESD protection die 5 is a back-to-back LED structure of PNP or NPN arrangement, similar to that shown in FIG. 9. The characteristic of the embodiment shown in FIG. 12 is that there are a plurality of parallel-connected LEDs 2 mounted on the sub-mounts 3, 4 by a flip chip process. With reference to the circuitry shown in FIG. 13, the external anode and cathode electrodes connecting to the sub-mounts 3, 4 are shared by the plural parallel-connected LEDs 2, such that the LED assembly of this embodiment is able to emit light brighter than that of aforementioned embodiment of the invention, and thus a high power light module can be achieved.

To sum up, the advantages of a LED assembly of the invention can be concluded as following:

(1) By connecting light emitting device to sub-mounts directly by a flip chip process, the light emitting area of the LED assembly is increased and thus the brightness is enhanced.

(2) By employing sub-mounts made of high thermal conductivity, the resulting LED assembly can have better heat dissipating path, lower thermal resistance, enhanced illuminating efficiency, higher overall brightness output, enhanced heat dissipating ability and also prolong the life of its light emitting devices.

(3) Since the ESD protection die is suitable to be applied not only in a single chip package, but also in a serial multi-chip package or a parallel multi-chip package, the luminous flux per unit area is increase so that the LED assembly is suitable to be used in high brightness applications, such as flash light, projecting light, automobile head light, etc., or indoor/outdoor illuminating devices, such as indication light, alarming light, traffic light, automobile tail light, light source for projectors, and light source for backlight module, etc.

(4) The damage of transient over-voltage to the high power LED assembly, which is caused by electro-static discharge, can be prevented.

While the preferred embodiment of the invention has been set forth for the purpose of disclosure, modifications of the disclosed embodiment of the invention as well as other embodiments thereof may occur to those skilled in the art. Accordingly, the appended claims are intended to cover all embodiments which do not depart from the spirit and scope of the invention.

What is claimed is:

1. A light emitting device assembly utilizing electro-static-discharge (ESD) protective means sandwiched between dual sub-mounts, comprising:

at least a light emitting device, each capable of emitting light;

at least two sub-mounts, disposed adjacent to different side ends of the light emitting device and under the at least one light emitting device while electrically connecting to anode and cathode electrodes of the at least one light emitting device in respective; and at least an ESD protection die, each being horizontally sandwiched and glued between the at least two sub-mounts.

2. The light emitting device assembly utilizing electro-static-discharge (ESD) protective means sandwiched between dual sub-mounts of claim 1, wherein the at least one light emitting device is a solid-state light source.

3. The light emitting device assembly utilizing electro-static-discharge (ESD) protective means sandwiched between dual sub-mounts of claim 2, wherein the solid-state light source is a light emitting diode (LED) with a p-side electrode and an n-side electrode.

4. The light emitting device assembly utilizing electro-static-discharge (ESD) protective means sandwiched between dual sub-mounts of claim 3, wherein the p-side and the n-side electrodes are arranged at different sides of each corresponding LED while connecting respectively to different sub-mount of the at least two sub-mounts.

5. The light emitting device assembly utilizing electro-static-discharge (ESD) protective means sandwiched between dual sub-mounts of claim 1, wherein the light emitting surface of each light emitting device is sealed and packaged by a transparent material.

6. The light emitting device assembly utilizing electro-static-discharge (ESD) protective means sandwiched between dual sub-mounts of claim 5, wherein the transparent material is a resin selected from the group consisting of transparent resins and epoxy resin.

7. The light emitting device assembly utilizing electro-static-discharge (ESD) protective means sandwiched between dual sub-mounts of claim 1, wherein the thickness of each sub-mount is ranged between 300 µm and 3000 µm.

8. The light emitting device assembly utilizing electro-static-discharge (ESD) protective means sandwiched between dual sub-mounts of claim 1, wherein the overall measure of length and width of an assembly integrating the sub-mounts and the at least one ESD protection die are respectively fallen in the range of 300 µm~6000 µm.

9. The light emitting device assembly utilizing electro-static-discharge (ESD) protective means sandwiched between dual sub-mounts of claim 1, wherein each sub-mount is made of a metal of high conductivity and high thermal conductivity, such as copper, aluminum, iron, or the alloy thereof.

10. The light emitting device assembly utilizing electro-static-discharge (ESD) protective means sandwiched between dual sub-mounts of claim 1, wherein each sub-mount is made of a composite metallic material of high conductivity, high thermal conductivity and low thermal expansion coefficient.

11. The light emitting device assembly utilizing electro-static-discharge (ESD) protective means sandwiched between dual sub-mounts of claim 10, wherein the coefficient of thermal expansion of each sub-mount made of composite metallic material is ranged between 4 ppm/° C. and 10 ppm/° C.

12. The light emitting device assembly utilizing electro-static-discharge (ESD) protective means sandwiched between dual sub-mounts of claim 1, wherein the contour of each sub-mount is a polygon.

13. The light emitting device assembly utilizing electro-static-discharge (ESD) protective means sandwiched between dual sub-mounts of claim 1, wherein the contour of each sub-mount is a circle.

14. The light emitting device assembly utilizing electro-static-discharge (ESD) protective means sandwiched between dual sub-mounts of claim 1, wherein at least an inclined plane is formed inside each sub-mount, each being used for reflecting and congregating light emitted by the at least one light emitting device.

15. The light emitting device assembly utilizing electro-static-discharge (ESD) protective means sandwiched between dual sub-mounts of claim 1, wherein a conductive joint is formed inside each sub-mount for enabling a conducting wire to be welded and connected thereto while enabling the conducting wire to extend and protrude outside the sub-mount for connecting the same to an electrode selected from the group consisting of the anode electrode and the cathode electrode.

16. The light emitting device assembly utilizing electro-static-discharge (ESD) protective means sandwiched between dual sub-mounts of claim 1, wherein the thickness of each ESD protection die is ranged between 10 µm and 2000 µm.

17. The light emitting device assembly utilizing electro-static-discharge (ESD) protective means sandwiched between dual sub-mounts of claim 1, wherein each ESD protection die is a device selected from the group consisting of a zener diode, a Schottky-barrier diode, a silicon diode, a III-V Compound diode and the combination thereof.

18. The light emitting device assembly utilizing electro-static-discharge (ESD) protective means sandwiched between dual sub-mounts of claim 1, wherein each ESD protection die can be a back-to-back diode structure.

19. The light emitting device assembly utilizing electro-static-discharge (ESD) protective means sandwiched between dual sub-mounts of claim 18, wherein the polarity arrangement of the back-to-back diode structure is selected from the group consisting of PNP and NPN.

20. The light emitting device assembly utilizing electro-static-discharge (ESD) protective means sandwiched between dual sub-mounts of claim 1, being a multi-chip LED assembly while the assembly comprising a plurality of parallel-connected light emitting devices, a plurality of parallel-connected sub-mounts and a plurality of parallel-connected ESD protection dies.

* * * * *